United States Patent
Takahashi (10) Patent No.: US 10,589,305 B2
(45) Date of Patent: Mar. 17, 2020

(54) SUBSTRATE TREATING APPARATUS, AND METHOD OF CONTROLLING THE SUBSTRATE TREATING APPARATUS

(71) Applicant: SCREEN Holdings Co., Ltd., Kyoto (JP)

(72) Inventor: Yasuo Takahashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 244 days.

(21) Appl. No.: 15/553,732

(22) PCT Filed: Jan. 27, 2016

(86) PCT No.: PCT/JP2016/052390

§ 371 (c)(1),
(2) Date: Aug. 25, 2017

(87) PCT Pub. No.: WO2016/136367

PCT Pub. Date: Sep. 1, 2016

(65) Prior Publication Data

US 2018/0029059 A1 Feb. 1, 2018

(30) Foreign Application Priority Data

Feb. 27, 2015 (JP) ................................. 2015-039526

(51) Int. Cl.
*B05C 11/08* (2006.01)
*B05B 12/02* (2006.01)
(Continued)

(52) U.S. Cl.
CPC ................ *B05B 12/02* (2013.01); *B05B 3/02* (2013.01); *B05B 15/55* (2018.02); *B05C 11/08* (2013.01);
(Continued)

(58) Field of Classification Search
CPC B05C 11/08; B05C 11/10; B05C 5/00; B05D 1/005; H01L 21/6715; H01L 21/67051; B05B 12/02; B05B 15/55
(Continued)

(56) References Cited

U.S. PATENT DOCUMENTS

2003/0059534 A1* 3/2003 Nishijima ........... H01L 21/6715
427/240
2005/0145168 A1* 7/2005 Inada ...................... G03F 7/162
118/416
(Continued)

FOREIGN PATENT DOCUMENTS

JP H04-200768 A 7/1992
JP 2923044 B2 7/1999
(Continued)

OTHER PUBLICATIONS

International Search Report dated Apr. 12, 2016 in corresponding PCT International Application No. PCT/JP2016/052390.
(Continued)

*Primary Examiner* — Kirsten Jolley
(74) *Attorney, Agent, or Firm* — Ostrolenk Faber LLP (57) ABSTRACT

In a coating apparatus, a nozzle moving mechanism selectively grips any one of a plurality of coating solution nozzles, moves the gripped coating solution nozzle and a solvent nozzle together, and moves at least the solvent nozzle to a solvent suction unit. The moved solvent nozzle is caused to dispense a solvent to the solvent suction unit, and the gripped coating solution nozzle is caused to suck the solvent retained in the same solvent suction unit to which the solvent has been dispensed. Thus, since dispensation and suction of the solvent are done in the same solvent suction unit, the quantity of the solvent used can be held down. Further, a supply line for supplying the solvent does not need to be provided for the suction unit. The construction of the
(Continued)

suction unit can therefore be made simple, and its cost can be held down.

10 Claims, 7 Drawing Sheets

(51) Int. Cl.
    *B05C 11/10*     (2006.01)
    *H01L 21/67*     (2006.01)
    *B05B 15/55*     (2018.01)
    *B05D 1/00*     (2006.01)
    *B05B 3/02*     (2006.01)
    *B05D 1/02*     (2006.01)
    *B05C 5/00*     (2006.01)

(52) U.S. Cl.
    CPC .............. *B05C 11/10* (2013.01); *B05D 1/005* (2013.01); *B05D 1/02* (2013.01); *H01L 21/6715* (2013.01); *H01L 21/67051* (2013.01); *B05C 5/00* (2013.01)

(58) Field of Classification Search
    USPC ............................................ 427/240; 118/52
    See application file for complete search history.

(56) References Cited

U.S. PATENT DOCUMENTS

| | | | |
|---|---|---|---|
| 2006/0233952 A1 | 10/2006 | Nakashima et al. .......... | 427/240 |
| 2007/0245953 A1* | 10/2007 | Nakashima ............. | B05C 11/08 |
| | | | 118/313 |
| 2010/0051059 A1* | 3/2010 | Kometani ................. | B08B 9/00 |
| | | | 134/21 |
| 2012/0164572 A1* | 6/2012 | Miyata ................ | H01L 21/6715 |
| | | | 430/270.1 |
| 2014/0352730 A1 | 12/2014 | Kai et al. ................... | 134/22.11 |

FOREIGN PATENT DOCUMENTS

| | | |
|---|---|---|
| JP | 2003-178965 A | 6/2003 |
| JP | 2006-302934 A | 11/2006 |
| JP | 2010-253403 A | 11/2010 |
| JP | 4606234 B2 | 1/2011 |
| JP | 5442232 B2 | 3/2014 |
| JP | 2015-006652 A | 1/2015 |

OTHER PUBLICATIONS

Written Opinion dated Apr. 12, 2016 in corresponding PCT International Application No. PCT/JP2016/052390.

* cited by examiner

SUBSTRATE TREATING APPARATUS, AND METHOD OF CONTROLLING THE SUBSTRATE TREATING APPARATUS

RELATED APPLICATIONS

This application is the U.S. National Phase application under 35 U.S.C. § 371, of international Application No. PCT/JP2016/052390, filed on Jan. 27, 2016, which in turn claims the benefit of Japanese Application No. 2015-039526, filed on Feb. 27, 2015, the disclosures of which applications are incorporated by reference herein.

TECHNICAL FIELD

This invention relates to a substrate treating apparatus, and a method of controlling the substrate treating apparatus, concerning nozzles for dispensing a photoresist solution or the like to substrates such as semiconductor substrates, glass substrates for liquid crystal displays, glass substrate for photomasks, substrates for optical disks and so on, in which the nozzles are caused to suck a solvent or the like.

BACKGROUND ART

Conventionally, substrate treating apparatus include a coating apparatus for coating substrates with a coating solution such as of photoresist. The coating apparatus has a holding and spinning unit for holding and spinning each substrate, a plurality of coating solution nozzles which dispense the coating solution, and a nozzle moving mechanism for moving the coating solution nozzles to arbitrary positions. The plurality of coating solution nozzles are held in standby pots provided laterally of the holding and spinning unit and in the same number as the coating solution nozzles (see Patent Publications 1-3, for example). The nozzle moving mechanism grips one of the coating solution nozzles standing by in the standby pots.

Figure 10:
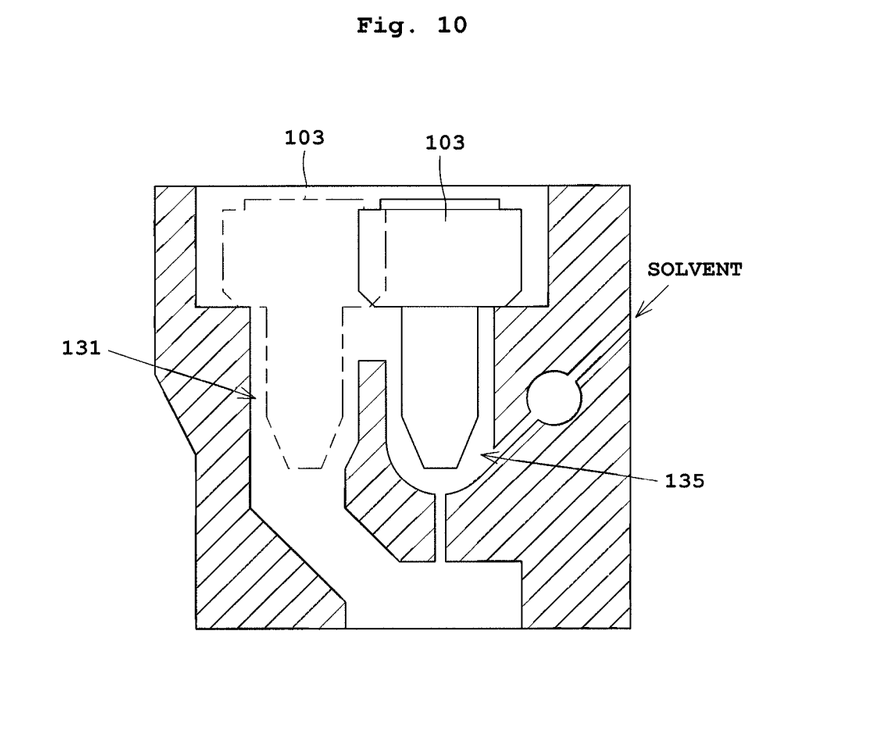
FIG. 10 is a view illustrating a relationship between a conventional coating nozzle and a standby pot shown in vertical section.
Figure 11:
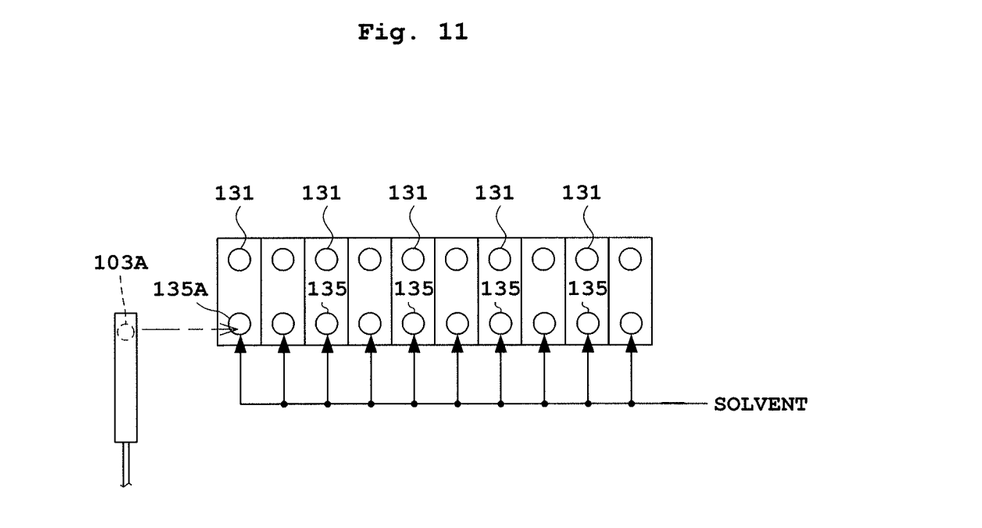
FIG. 11 is a plan view showing conventional standby pots.

As shown in FIG. 10, each standby pot is capable of dummy dispensation, and includes a nozzle standby portion 131 for receiving a coating solution nozzle on standby, and a solvent suction portion 135 for a solvent to be sucked into a tip end of the coating solution nozzle. Where the coating apparatus has ten coating solution nozzles, as shown in FIG. 11, the standby pots are provided in an array of ten sets each including one nozzle standby portion 131 and one solvent suction portion 135.

Prior Art Documents

Patent Documents

[Patent Document 1]
U.S. Pat. No. 5,442,232 publication
[Patent Document 2]
U.S. Pat. No. 2,923,044 publication
[Patent Document 3]
U.S. Pat. No. 4,606,234 publication

SUMMARY OF INVENTION

Technical Problem

However, the conventional coating apparatus has the following problems. When causing a coating solution nozzle 103A to suck the solvent in FIG. 11, solvent supply to the standby pots is performed not only for a solvent suction portion 135A but for all the other solvent suction portions 135 as well. This poses a problem of consuming the solvent in an increased quantity.

Since the construction of the standby pots is complicated, there is a problem that cleaning of the solvent suction portions 135 and component replacement of the solvent suction portions 135 is difficult. That is, the coating solution nozzles 103 are the parts which approach nearest the substrates, and are desired to be in clean state. Sucking operation is carried out simultaneously with cleaning of the coating solution nozzles, and the coating solution nozzles contact the solvent then. However, after use over a long period of time and repeated sucking operations, there will arise a situation in which whether cleaning has been done is difficult to determine. So, it is desirable to clean the solvent suction portions 135 periodically.

However, as shown in FIG. 10 and FIG. 11, each standby pot has a complicated construction and the solvent suction portion 135 is an intricate part near the nozzle standby portion 131. It is therefore difficult to clean the solvent suction portion 135 in that position. Since the nozzle standby portion 131 and solvent suction portion 135 have an integral construction, it is difficult to detach only the solvent suction portion 135 for component replacement. Since the construction of the standby pot is complicated, there is a problem of high cost.

Patent Document 2 discloses a dedicated cleaning liquid tube connected to a nozzle for feeding a cleaning liquid to a nozzle tip to clean the nozzle tip. Patent Document 3 discloses a construction having a plurality of treating liquid supply nozzles and one solvent supply nozzle integrally fixed to a common support. To each solvent storage portion for a solvent to be sucked into the tip of each treating liquid supply nozzle, the solvent supply nozzle moves in order and dispenses the solvent. This requires operation to move the treating liquid supply nozzles horizontally between dispensation of the solvent and suction of the solvent.

This invention has been made having regard to the state of the art noted above, and its object is to provide a substrate treating apparatus and a method of controlling the substrate treating apparatus, which can reduce consumption of a solvent or the like, and can facilitate cleaning and component replacement.

Solution to Problem

To fulfill the above object, this invention provides the following construction.

A substrate treating apparatus, according to this invention, comprises a plurality of first nozzles for dispensing a first treating liquid to substrates; a second nozzle for dispensing a second treating liquid to the substrates; a nozzle moving mechanism for gripping one of the plurality of first nozzles and moving the gripped first nozzle and the second nozzle together; a suction unit for allowing the gripped first nozzle to suck the second treating liquid; and a controller for causing the nozzle moving mechanism to move at least the second nozzle to the suction unit, causing the moved second nozzle to dispense the second treating liquid to the suction unit, and causing the gripped first nozzle to suck the second treating liquid retained in the suction unit to which the second treating liquid has been dispensed.

According to the substrate treating apparatus of this invention, the nozzle moving mechanism selectively grips any one of the plurality of first nozzles, moves the gripped first nozzle and the second nozzle together, and moves at least the second nozzle to the suction unit. And the moved second nozzle is caused to dispense the second treating liquid to the suction unit, and the gripped first nozzle is caused to suck the second treating liquid retained in the same suction unit to which the second treating liquid has been dispensed. Thus, since the dispensation and suction of the second treating liquid are done in the same suction unit, the quantity of the second treating liquid used can be held down. A supply line for supplying the second treating liquid does not need to be provided for the suction unit. The construction of the suction unit can therefore be made simple, and its cost can be held down.

In the above substrate treating apparatus, it is preferred that the suction unit is provided in a number smaller than the plurality of first nozzles; and the controller causes the nozzle moving mechanism to move at least the second nozzle to one of the suction units. That is, the suction unit has a construction to be shared by the plurality of first nozzles. Since suction units corresponding in number to the plurality of first nozzles are not provided, the construction of the suction unit becomes still simpler. Cost can therefore be held down. Further, since suction units corresponding in number to the plurality of first nozzles are not provided, cleaning of the suction unit can be made easy.

It is preferred that the above substrate treating apparatus further comprises a nozzle standby portion for receiving the first nozzles on standby; wherein the suction unit is provided separate from the nozzle standby portion. Since the suction unit is provided separate from the complicated nozzle standby portion, cleaning of the suction unit can be carried out easily. Since the suction unit can be removed for cleaning and other purposes, while the standby portion remains attached thereto, component replacement is easy. As described above, since the second treating liquid is supplied to the suction unit from the second nozzle, it is not necessary to provide a supply line for supplying the second treating liquid to the suction unit. Thus, since an operation for removing piping of the supply line is omitted at a time of component replacement, components can be replaced easily. Compared with a complicated integral construction, the construction of each of the nozzle standby portion and the suction unit can be further simplified to hold down cost.

One example of the above substrate treating apparatus further comprises a plurality of holding and spinning units for holding and spinning the substrates; wherein the suction unit is provided between two adjacent holding and spinning units of the plurality of holding and spinning units. This provides an effect of excellent access to the suction unit. Assume, for example, that the nozzle moving mechanism moves a first nozzle engaged in substrate treatment from one substrate (holding and spinning unit) to the other substrate (holding and spinning unit). At this time, suction operation can be carried out efficiently for another first nozzle on standby.

In one example of the above substrate treating apparatus, the controller causes the nozzle moving mechanism to move the first nozzle and the second nozzle to the suction unit, after the movement, in a state of positions of the gripped first nozzle, the second nozzle, and the suction unit being fixed, causes the second nozzle to dispense the second treating liquid to the suction unit, and causes the gripped first nozzle to suck the second treating liquid retained in the suction unit to which the second treating liquid has been dispensed. Since dispensation and suction of the second treating liquid are carried out in the state of positions of the gripped first nozzle, the second nozzle, and the suction unit being fixed, suction operation can be carried out efficiently.

In the above substrate treating apparatus, it is preferred that the suction unit has a receiving vessel for receiving the second treating liquid dispensed from the second nozzle, and a retaining vessel provided separate from the receiving vessel and communicating with the receiving vessel; and the controller causes the second nozzle to dispense the second treating liquid to the receiving vessel, and causes the gripped first nozzle to suck the second treating liquid retained in the retaining vessel. The receiving vessel for receiving the second treating liquid from the second nozzle, and the retaining vessel for the first nozzle to suck the second treating liquid, are made separate vessels. Consequently, at the time of dispensation of the second treating liquid from the second nozzle, splashes of the second treating liquid can be prevented from adhering to the first nozzle. This can shorten time until the retaining vessel accumulates a sufficient quantity of second treating liquid, and can hold down the quantity of second treating liquid used. When splashes of the second treating liquid adhere to the first nozzle, there arises a possibility of droplets of the adhering second treating liquid falling on the substrates.

In one example of the above substrate treating apparatus, the controller causes the nozzle moving mechanism to move the second nozzle to the suction unit, and causes the moved second nozzle to dispense the second treating liquid to the suction unit; and the controller causes the nozzle moving mechanism to move the gripped first nozzle at least horizontally to the suction unit to which the second treating liquid has been dispensed, and after the movement of the first nozzle, causes the gripped first nozzle to suck the second treating liquid retained in the suction unit. Consequently, the suction unit can be reduced in size. The construction of the suction unit can therefore be made still simpler to hold down cost.

In the above substrate treating apparatus, one example of the first treating liquid is a coating solution for forming film on the substrates. This can reduce consumption of the second treating liquid sucked by the first nozzle which dispenses the coating solution. In the above substrate treating apparatus, one example of the second treating liquid is a solvent. This can reduce consumption of the solvent sucked.

A method of controlling a substrate treating apparatus, according to this invention, is a method of controlling a substrate treating apparatus having a plurality of first nozzles for dispensing a first treating liquid to substrates, and a second nozzle for dispensing a second treating liquid to the substrates, the method comprising a step of causing a nozzle moving mechanism for gripping one of the plurality of first nozzles and moving the gripped first nozzle and the second nozzle together to move at least the second nozzle to the suction unit; a step of causing the moved second nozzle to dispense the second treating liquid to the suction unit; and a step of causing the gripped first nozzle to suck the second treating liquid retained in the suction unit to which the second treating liquid has been dispensed.

According to the method of controlling the substrate treating apparatus of this invention, the nozzle moving mechanism selectively grips any one of the plurality of first nozzles, moves the gripped first nozzle and the second nozzle together, and moves at least the second nozzle to the suction unit. And the moved second nozzle is caused to dispense the second treating liquid to the suction unit, and the gripped first nozzle is caused to suck the second treating liquid retained in the same suction unit to which the second treating liquid has been dispensed. Thus, since the dispensation and suction of the second treating liquid are done in the same suction unit, the quantity of the second treating liquid used can be held down. A supply line for supplying the second treating liquid does not need to be provided for the suction unit. The construction of the suction unit can therefore be made simple, and its cost can be held down.

Advantageous Effects of Invention

According to the substrate treating apparatus and its controlling method of this invention, the nozzle moving mechanism selectively grips any one of the plurality of first nozzles, moves the gripped first nozzle and the second nozzle together, and moves at least the second nozzle to the suction unit. And the moved second nozzle is caused to dispense the second treating liquid to the suction unit, and the gripped first nozzle to suck the second treating liquid retained in the same suction unit to which the second treating liquid has been dispensed. Thus, since the dispensation and suction of the second treating liquid are done in the same suction unit, the quantity of the second treating liquid used can be held down. A supply line for supplying the second treating liquid does not need to be provided for the suction unit. The construction of the suction unit can therefore be made simple, and its cost can be held down.

BRIEF DESCRIPTION OF THE DRAWINGS

FIG. 3(a) is a view illustrating a relationship between a coating solution nozzle, a solvent nozzle, and a solvent suction unit shown in vertical section, and (b) is a plan view of the solvent suction unit.

FIG. 8(a) is a view showing an operation for dispensing the solvent according to a modification, and (b) is a view showing an operation for sucking the solvent according to the modification.

FIG. 9(a) is a view showing an operation for dispensing the solvent according to a modification, and (b) is a view showing an operation for sucking the solvent according to the modification.

DESCRIPTION OF EMBODIMENTS

Figure 1:
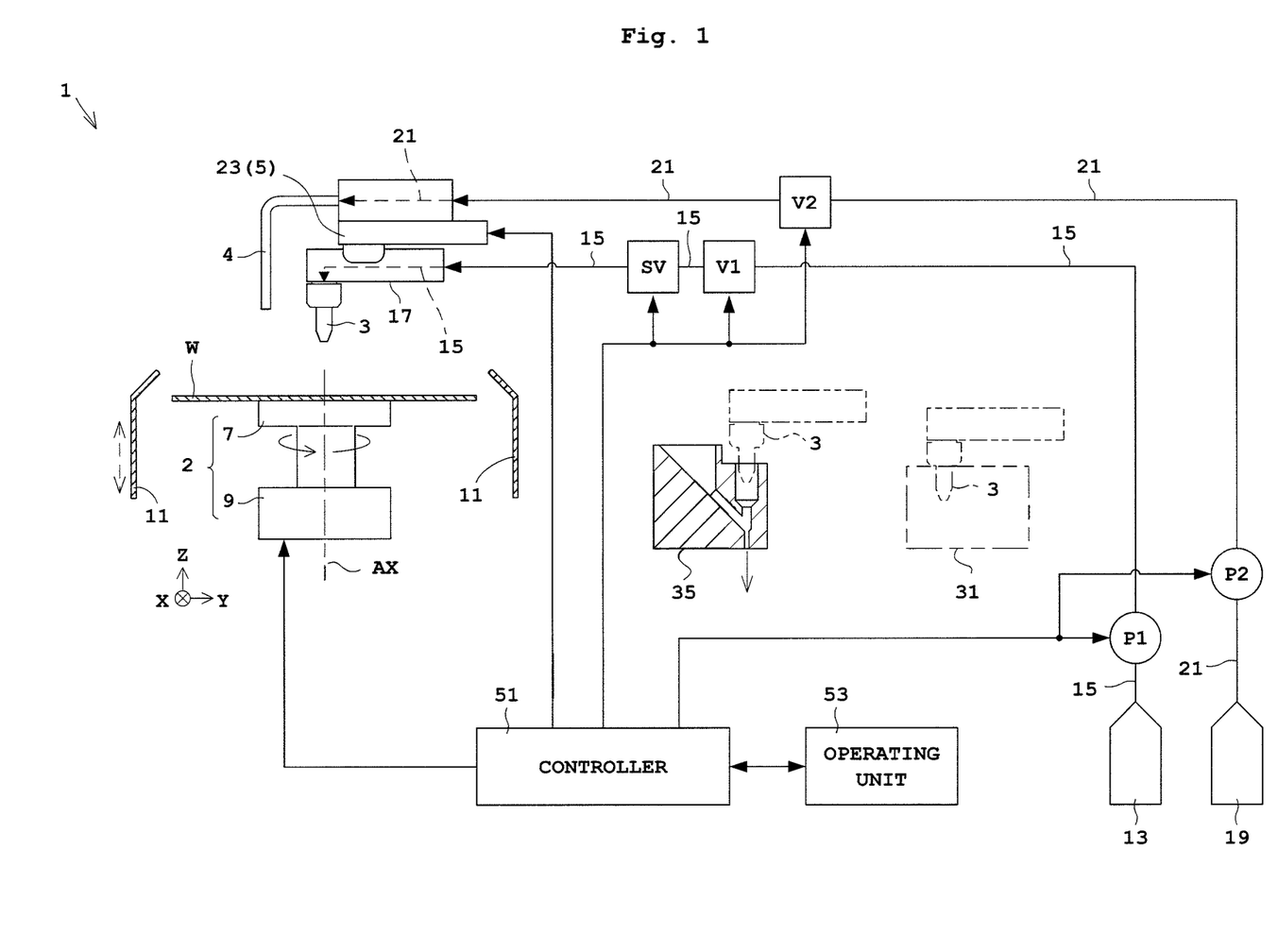
FIG. 1 is a block diagram of a coating apparatus according to an embodiment.
Figure 2:
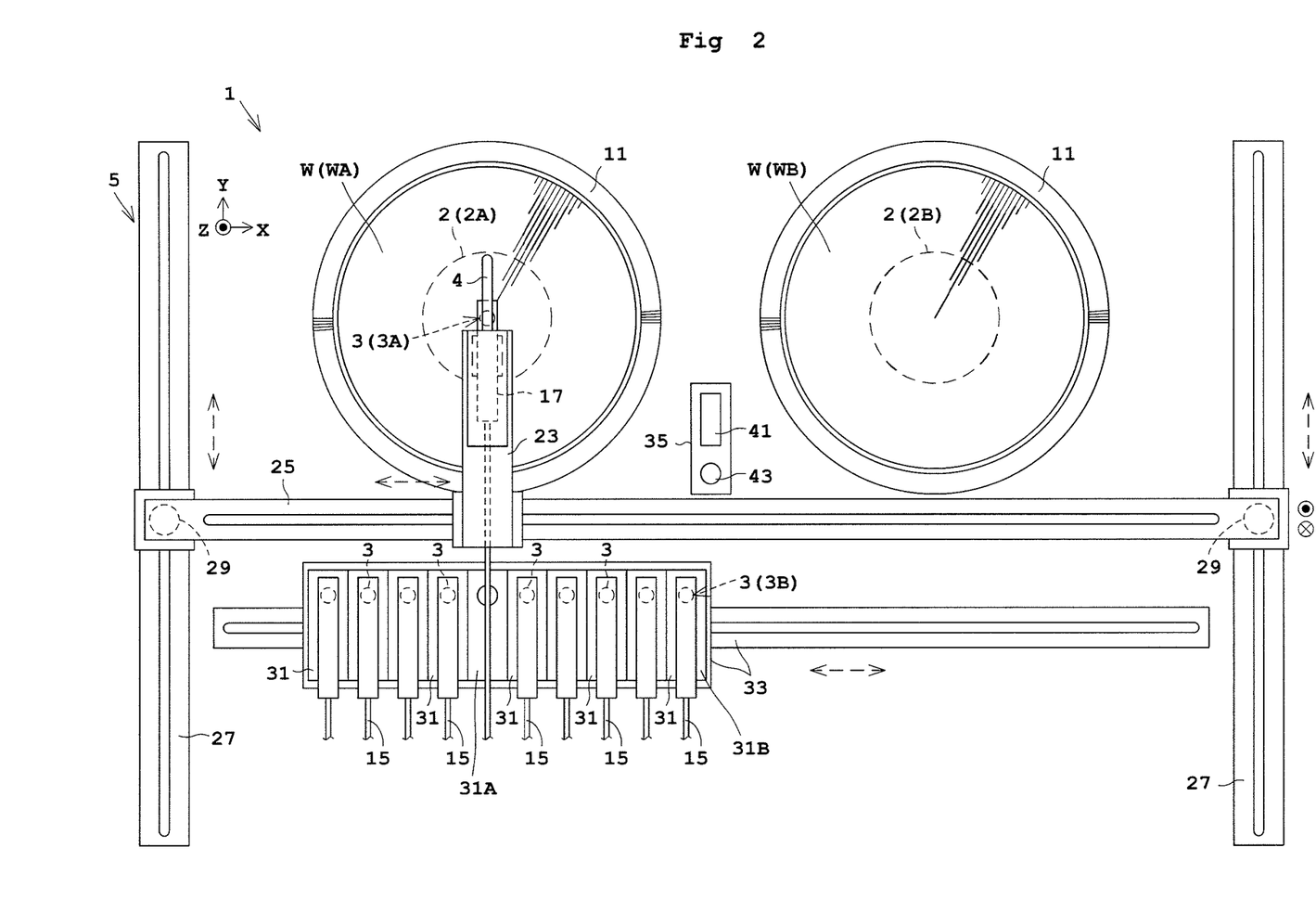
FIG. 2 is a plan view of the coating apparatus according to the embodiment.

An embodiment of this invention will be described hereinafter with reference to the drawings. FIG. 1 is a block diagram of a coating apparatus according to the embodiment, and FIG. 2 is a plan view of the coating apparatus according to the embodiment. FIG. 3(a) is a view illustrating a relationship between a coating solution nozzle, a solvent nozzle, and a solvent suction unit shown in vertical section, and FIG. 3(b) is a plan view of the solvent suction unit.

Reference is made to FIG. 1 and FIG. 2. A coating apparatus 1 includes holding and spinning units 2 for holding and spinning substrates W in a substantially horizontal position. Further, the coating apparatus 1 includes a coating solution nozzle 3 for dispensing a coating solution to the substrates W, a solvent nozzle 4 for dispensing a solvent to the substrates W, and a nozzle moving mechanism 5 for moving the coating solution nozzle 3 and solvent nozzle 4 together.

The coating solution is used to form film on the substrate W. The coating solution used here is a photoresist solution, SOG (Spin on glass coating) solution, SOD (Spin on dielectric coating) solution, polyimide resin solution, or the like. The solvent used is a thinner, for example. The coating solution nozzle 3 corresponds to the first nozzle in this invention. The solvent nozzle 4 corresponds to the second nozzle in this invention. The coating solution corresponds to the first treating liquid in this invention. The solvent corresponds to the second treating liquid in this invention.

Each holding and spinning unit 2 includes a spin chuck 7 for holding the back surface of a substrate W by vacuum suction, for example, and a spin driver 9 in the form of a motor, for example, which rotates the spin chuck 7 about a substantially vertical rotation axis AX. A vertically movable cup 11 is disposed around the holding and spinning unit 2 to surround laterally of the substrate W.

The coating solution is supplied to the coating solution nozzle 3 from a coating solution supply source 13 through coating solution piping 15. The coating solution piping 15 has a suckback valve SV, a switch valve V1 and a pump P1 arranged in intermediate positions thereof. The switch valve V1 supplies and stops supply of the coating solution. The suckback valve SV is operable in combination with operation of the switch valve V1 to suck the coating solution and other substances from the coating solution nozzle 3, and pushes out the coating solution and other substances sucked. The pump P1 feeds the coating solution to the coating solution nozzle 3. The coating solution nozzle 3 is attachably and detachably supported by a support block 17. Where a plurality of coating solution nozzles 3 are provided, each coating solution nozzle 3 has a supply line including the coating solution supply source 13, coating solution piping 15, switch valve V1, suckback valve SV, and pump P1.

The solvent is supplied to the solvent nozzle 4 from a solvent supply source 19 through solvent piping 21. The solvent piping 21 has a switch valve V2 and a pump P2 arranged in intermediate positions thereof. The switch valve V2 supplies and stops supply of the solvent. The pump P2 feeds the solvent to the solvent nozzle 4. The solvent is used in pre-wet treatment, for example. That is, the pre-wet treatment is carried out to dispense the solvent from the solvent nozzle 4 to the substrate W, spread the solvent dispensed and having landed on the substrate W substantially over the entire surface of the substrate W by spinning the substrate W. Then, photoresist is dispensed from the coating solution nozzle 3 to the substrate W. Consequently, photoresist film can be formed quickly and uniformly.

Figure 3:
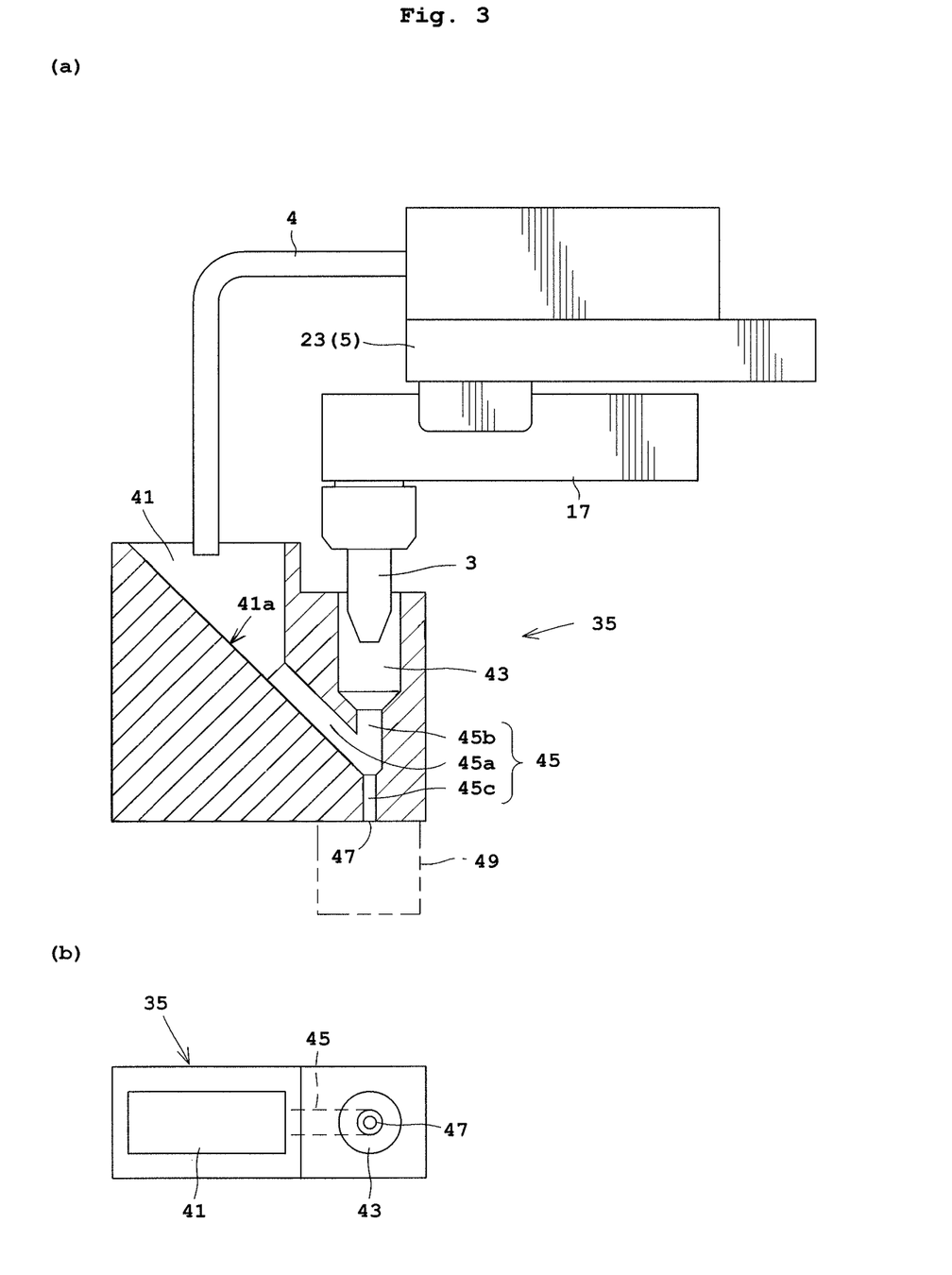

The solvent nozzle 4 is attached (fixed) to the nozzle moving mechanism 5. As shown in FIG. 1-FIG. 3, for example, a single solvent nozzle 4 is attached to a gripper 23 described hereinafter. A plurality of solvent nozzles 4 may be attached as arranged in a line.

As shown in FIG. 2, the nozzle moving mechanism 5 includes the gripper 23 which grips the coating solution nozzle 3, and a first horizontal movement portion 25 for horizontally moving the gripper 23 in a first direction (X-direction). Further, the nozzle moving mechanism 5 includes second horizontal movement portions 27 for horizontally moving the gripper 23 in a second direction (Y-direction) substantially perpendicular to the first direction, and vertical movement portions 29 for moving the gripper 23 in a vertical direction (Z-direction).

For example, the gripper 23 is supported by the first horizontal movement portion 25 to be movable in the first direction. The first horizontal movement portion 25 is supported by the vertical movement portions 29 to be vertically movable. The vertical movement portions 29 are supported by the second horizontal movement portions 27 to be movable in the second direction. The gripper 23, first horizontal movement portion 25, second horizontal movement portions 27 and vertical movement portions 29 are driven by motors, air cylinders, or the like. The nozzle moving mechanism 5 may include a horizontal articulated arm instead of at least either the first horizontal movement portion 25 or the second horizontal movement portions 27.

There are provided ten (a plurality of) coating solution nozzles 3, for example. When coating the substrate W with the coating solution, the nozzle moving mechanism 5 selectively grips any one of the ten coating solution nozzles 3, and moves the gripped treating solution nozzle 3 along with the solvent nozzle 4 to a position above the substrate W. When not coating the substrate W with the coating solution, the nozzle moving mechanism 5 usually moves the treating solution nozzle 3 to a standby pot 31.

The standby pot 31 is provided for receiving the coating solution nozzle 3 on standby, and can accommodate the coating solution nozzle 3. The standby pot 31 is provided for each of the plurality of coating solution nozzles 3. Where, for example, the coating apparatus 1 has ten coating solution nozzles 3, ten standby pots 31 are provided. In each standby pot 31, the coating solution nozzle 3 can make dummy dispensation of the coating solution, and a waste liquid collecting portion, not shown, is provided.

As shown in FIG. 2, for example, there are provided two (a plurality of) holding and spinning units 2. The holding and spinning unit 2 may be provided singly. The ten standby pots 31 can be moved together by a standby pot moving mechanism 33 along the first direction (X-direction) in which the two holding and spinning units 2 are arranged. The standby pot moving mechanism 33 is movable based on the position of the gripper 23, for example, to be located near the gripper 23. The standby pot moving mechanism 33 is driven by a motor or the like.

The standby pots 31 correspond to the nozzle standby portion of this invention. The group of standby pots 31 may be fixed to a predetermined position instead of being movable. The plurality of standby pots 31 are separate from one another, but may be integrated instead of being separate from one another.

For each coating solution nozzle 3 on standby in the standby pot 31, when not used for a predetermined period, dummy dispensation is carried out in order to prevent drying solidification of the coating solution in the coating solution nozzle 3. However, a high frequency of dummy dispensation will waste the coating solution. So, the frequency of dummy dispensation is reduced by sucking the solvent into the tip of the coating solution nozzle 3 to form a lid of the solvent. The coating apparatus 1 has a solvent suction unit 35 for allowing the coating solution nozzle 3 gripped by the nozzle moving mechanism 5 to suck the solvent.

The solvent suction unit 35 is not integral with the standby pots 31 as shown in FIG. 10, but is provided separate from the standby pots 31 as shown in FIG. 2. One solvent suction unit 35 is disposed between the two adjacent holding and spinning units 2 (specifically between the two holding and spinning units 2 and the standby pots 31). That is, one solvent suction unit 35 is provided for the ten (plurality of) standby pots 31. The solvent suction unit 35 corresponds to the suction unit in this invention.

A specific construction of the solvent suction unit 35 will be described. The solvent suction unit 35, as shown in FIG. 3(*a*) and FIG. 3(*b*), includes a receiving vessel 41 for receiving the solvent dispensed from the solvent nozzle 4, and a retaining vessel 43 formed separately from the receiving vessel 41 and communicating with the receiving vessel 41. The retaining vessel 43 is provided for accommodating the coating solution nozzle 3, retaining the solvent, and allowing the coating solution nozzle 3 to suck the solvent. The solvent fed to the receiving vessel 41 flows into the retaining vessel 43 communicating with the receiving vessel 41.

The bottom of the receiving vessel 41 and the bottom of the retaining vessel 43 are connected through a communicating pipe 45, as a construction for allowing the solvent to flow freely. The communicating pipe 45 is connected also with a drain port 47. The communicating pipe 45 includes piping 45*a* adjacent the receiving vessel 41, piping 45*b* adjacent the retaining vessel 43, and piping 45*c* adjacent the drain port 47. In order to retain in the retaining vessel 43 temporarily the solvent fed to the receiving vessel 41, the solvent is made to flow less easily through the piping 45*c* than through the piping 45*b*, without providing a switch valve. Consequently, the solvent is made to overflow into the retaining vessel 43 so that the solvent be retained in the retaining vessel 43 in a relatively gentle manner. With the retained solvent, the coating solution nozzle 3 can suck in the solvent, and the inside and outside of the coating solution nozzle 3 can be cleaned.

The solvent flowing out of the drain port 47 is collected in a waste liquid collecting portion 49 provided below the solvent suction unit 35. The receiving vessel 41 has a bottom 41*a* thereof sloping relative to the horizontal toward the communicating pipe 45. Consequently, the solvent can be fed efficiently into the communicating pipe 45, while preventing splashes of the solvent having reached the receiving vessel 41.

Reference is made back to FIG. 1. The coating apparatus 1 includes a controller 51 constructed of a central processing unit (CPU) and others, and an operating unit 53 for operating the coating apparatus 1. The controller 51 controls each component of the coating apparatus 1. The operating unit 53 has a display such as an LCD monitor, storage media such as a ROM (Read-only Memory), a RAM (Random-Access Memory) and a hard disk, and input devices such as a keyboard, a mouse and various buttons. The storage media store various conditions for coating treatment, and other information.

For example, the controller 51 operates the nozzle moving mechanism 5 to move a gripped coating solution nozzle 3 and the solvent nozzle 4 to the solvent suction unit 35. After this movement, the controller 51, in a state of positions (at least horizontal positions) of the gripped coating solution nozzle 3, solvent nozzle 4, and solvent suction unit 35 being fixed, causes the solvent to be dispensed from the solvent nozzle 4 to the receiving vessel 41 of the solvent suction unit 35. Then, the controller 51 operates the coating solution nozzle 3 to suck the solvent retained in the retaining vessel 43 of the solvent suction unit 35 to which the solvent has been dispensed.

Next, one example of operation of the coating apparatus 1 will be described. Here, as shown in FIG. 2, when coating two substrates WA and WB successively in order, for example, movement is made between the two substrates WA and WB (or the two holding and spinning units 2A and 2B). When, in the course of this movement, there is a second coating solution nozzle 3B on standby which needs suction operation, a solvent suction operation is carried out for the second coating solution nozzle 3B. Such suction operation is needed, for example, upon lapse of a predetermined time after dispensation of the coating solution from the coating solution nozzles 3.

Reference is made to FIG. 2. After the substrate WA held on the first holding and spinning unit 2A has been coated with the coating solution, the nozzle moving mechanism 5 moves a first coating solution nozzle 3A from above the substrate WA to a predetermined position above a first standby pot 31A. Then, the nozzle moving mechanism 5 lowers the first coating solution nozzle 3A, and operates the gripper 23 to release the first coating solution nozzle 3A. Consequently, the first coating solution nozzle 3A is placed on standby in the first standby pot 31A.

The nozzle moving mechanism 5 raises the gripper 23, and moves horizontally to a predetermined position above the second coating solution nozzle 3B which needs suction operation. Then, the nozzle moving mechanism 5 lowers the gripper 23 and causes the gripper 23 to grip the second coating solution nozzle 3B. When dummy dispensation is required for the second coating solution nozzle 3B, the coating solution and the previously sucked solvent in the second coating solution nozzle 3B are discharged therefrom before movement from a second standby pot 31B.

After the second coating solution nozzle 3B is gripped, the nozzle moving mechanism 5 raises the second coating solution nozzle 3B gripped by the gripper 23, and moves the second coating solution nozzle 3B to the predetermined position above the solvent suction unit 35. The nozzle moving mechanism 5 lowers the second coating solution nozzle 3B, and places the second coating solution nozzle 3B at a predetermined height as shown in FIG. 3(a).

Figure 4:
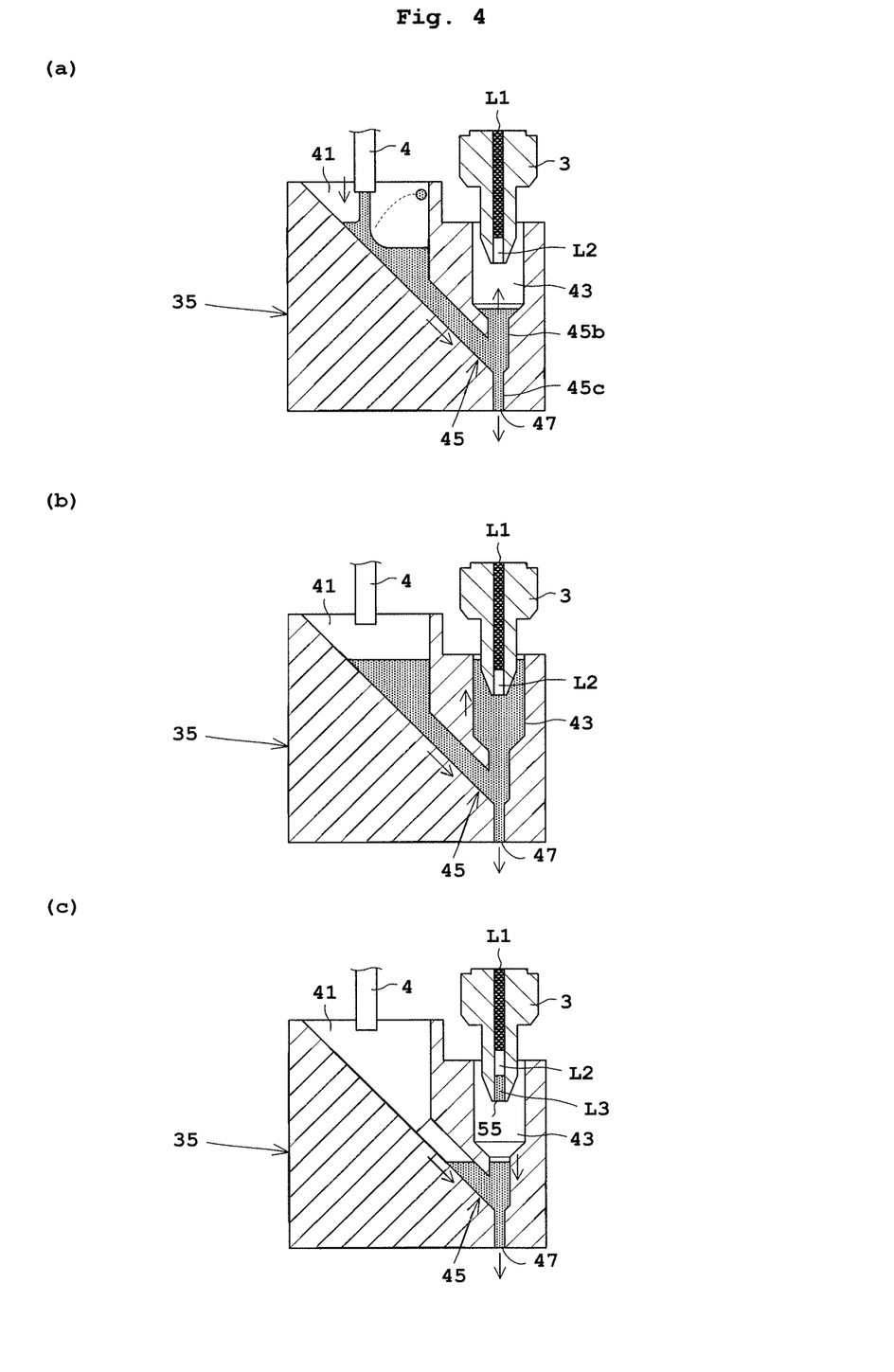
FIGS. 4(a)-(c) are views illustrating dispensation and suction operation.

FIG. 4(a)-FIG. 4(c) are views illustrating dispensation and suction operations. In this embodiment, the controller 51 operates the nozzle moving mechanism 5 to move the gripped coating solution nozzle 3 and the solvent nozzle 4 to the solvent suction unit 35. After this movement, the controller 51, in the state of positions (at least horizontal positions) of the gripped coating solution nozzle 3, solvent nozzle 4, and solvent suction unit 35 being fixed, causes the solvent to be dispensed from the solvent nozzle 4 to the receiving vessel 41 of the solvent suction unit 35, and operates the coating solution nozzle 3 to suck the solvent retained in the retaining vessel 43 of the same solvent suction unit 35 to which the solvent has been dispensed.

The fixation of the horizontal positions of the gripped coating solution nozzle 3, solvent nozzle 4, and solvent suction unit 35 may be an approximate fixation.

In FIG. 4(a), the coating solution nozzle 3 and solvent nozzle 4 are lodged in the solvent suction unit 35. The solvent nozzle 4 may be placed above the solvent suction unit 35 instead of being lodged in the solvent suction unit 35. The solvent nozzle 4 is operated to dispense the solvent to the receiving vessel 41 of the solvent suction unit 35. The solvent dispensed to the receiving vessel 41 flows into the retaining vessel 43 through the communicating pipe 45. The piping 45c makes the solvent less easy to flow therethrough than through the piping 45b. The solvent is therefore made to overflow into the retaining vessel 43, whereby the retaining vessel 43 retains the solvent relatively gently. Consequently, as shown in FIG. 4(b), the tip portion of a second coating solution nozzle 3B is immersed in the solvent. Thus, the lateral surface of the second coating solution nozzle 3B is cleaned by the solvent.

As shown in FIG. 4(a), a gas layer L2 such as of air is formed inside the tip of the coating solution nozzle 3. After the coating solution is dispensed to the substrate W or standby pot 31, the coating solution inside the tip of the coating solution nozzle 3 is sucked inward by the suckback valve SV in order to prevent spilling of the coating solution. The gas layer L2 is formed as a result.

In the state shown in FIG. 4(b), suction operation is carried out for the second coating solution nozzle 3B. That is, the suckback valve SV is driven for the second coating solution nozzle 3B to suck the solvent. This can dissolve the coating solution dried inside the tip of the second coating solution nozzle 3B. Since the second coating solution nozzle 3B is plugged with the solvent, the coating solution can be prevented from drying.

Within the retaining vessel 43, the second coating solution nozzle 3B is temporarily immersed in the solvent. However, as shown in FIG. 4(c), since the solvent is discharged through the drain port 47, all the solvent will soon be discharged from the drain port 47. The second coating solution nozzle 3B will have a solvent layer L3, gas layer L2, and coating solution layer L1 formed in order from a dispenser opening 55 thereof.

After the suction operation for the second coating solution nozzle 3B, the nozzle moving mechanism 5, in FIG. 2, raises the second coating solution nozzle 3B, and moves it horizontally from above the solvent suction unit 35 to a predetermined position above the second standby pot 31B. Then, the nozzle moving mechanism 5 lowers the second coating solution nozzle 3B, and causes the gripper 23 to release the second coating solution nozzle 3B. Consequently, the second coating solution nozzle 3B is placed on standby in a second standby pot 31B.

After the second coating solution nozzle 3B is placed on standby in the second standby pot 31B, the coating treatment of the substrate WB is resumed. The nozzle moving mechanism 5 raises the gripper 23, and moves the gripper 23 from above the second standby pot 31B to a predetermined position above the first standby pot 31A. After the movement, the nozzle moving mechanism 5 lowers the gripper 23, and causes the gripper 23 to grip the first coating solution nozzle 3A. Then, the nozzle moving mechanism 5 raises the first coating solution nozzle 3A gripped by the gripper 23, and moves the first coating solution nozzle 3A from above the first standby pot 31A to a predetermined position above the substrate WB for coating treatment.

According to this embodiment, the nozzle moving mechanism 5 selectively grips any one of the plurality of coating solution nozzles 3, moves the gripped coating solution nozzle 3 and the solvent nozzle 4 together, and moves the coating solution nozzle 3 and solvent nozzle 4 to the solvent suction unit 35. And the moved solvent nozzle 4 is caused to dispense the solvent to the solvent suction unit 35, and the gripped coating solution nozzle 3 is caused to suck the solvent retained in the same solvent suction unit 35 to which the solvent has been dispensed. Thus, since the dispensation and suction of the solvent are carried out in the same solvent suction unit 35, the quantity of solvent used can be held down. A supply line for supplying the solvent does not need to be provided for the solvent suction unit 35. The construction of the solvent suction unit 35 can therefore be made simple, and its cost can be held down.

The solvent suction unit 35 is provided as a stand-alone member. That is, the solvent suction unit 35 has a construction to be shared by the ten coating solution nozzles 3. Since solvent suction units 35 corresponding in number to the ten coating solution nozzles 3 are not provided, the construction of the solvent suction unit 35 becomes still simpler. Cost can therefore be held down. Further, since solvent suction units 35 corresponding in number to the ten coating solution nozzles 3 are not provided, cleaning of the solvent suction unit 35 can be made easy.

The coating apparatus 1 has the standby pots 31 for receiving the coating solution nozzles 3 on standby, with the solvent suction unit 35 provided separate from the standby pots 31. Since the solvent suction unit 35 is provided separate from the complicated standby pots 31, cleaning of the solvent suction unit 35 can be carried out easily. Since the solvent suction unit 35 can be removed for cleaning and other purposes, while the standby pots 31 remain attached thereto, component replacement is easy. As described above, since the solvent is supplied to the solvent suction unit 35 from the solvent nozzle 4, it is not necessary to provide a supply line for supplying the solvent to the solvent suction unit 35. Thus, since an operation for removing piping of the supply line is omitted at a time of component replacement, components can be replaced easily. Compared with a complicated integral construction, the construction of each of the standby pots 31 and the solvent suction unit 35 can be further simplified to hold down cost.

The coating apparatus 1 has the two holding and spinning units 2 for holding and spinning substrates W, with the solvent suction unit 35 provided between the two adjacent holding and spinning units 2. This provides an effect of excellent access to the solvent suction unit 35. Assume, for example, that the nozzle moving mechanism 5 moves a first coating solution nozzle 3A engaged in substrate treatment from one substrate WA (first holding and spinning unit 2A) to the other substrate WB (second holding and spinning unit 2B). At this time, suction operation can be carried out efficiently for another, second coating solution nozzle 3B on standby.

The solvent suction unit 35 includes the receiving vessel 41 for receiving the solvent dispensed from the solvent nozzle 4, and the retaining vessel 43 provided separate from the receiving vessel 41 and communicating with the receiving vessel 41. And the controller 51 causes the solvent nozzle 4 to dispense the solvent to the receiving vessel 41, and causes the gripped coating solution nozzle 3 to suck the solvent retained in the retaining vessel 43. The receiving vessel 41 for receiving the solvent from the solvent nozzle 4, and the retaining vessel 43 for the coating solution nozzle 3 to suck the solvent, are made separate vessels. Consequently, at the time of dispensation of the solvent from the solvent nozzle 4, splashes of the solvent can be prevented from adhering to the coating solution nozzle 3. The retaining vessel 43 can also accumulate the solvent easily. This can shorten time until the retaining vessel 43 accumulates a sufficient quantity of solvent, and can hold down the quantity of solvent used. When splashes of the solvent adhere to the coating solution nozzle 3, there arises a possibility of droplets of the adhering solvent falling on the substrates W.

The controller 51 operates the nozzle moving mechanism 5 to moves the coating solution nozzle 3 and solvent nozzle 4 to the solvent suction unit 35, after this movement, in a state of positions of the gripped coating solution nozzle 3, solvent nozzle 4, and solvent suction unit 35 being fixed, causes the solvent to be dispensed from the solvent nozzle 4 to the solvent suction unit 35, and operates the coating solution nozzle 3 to suck the solvent retained in the solvent suction unit 35. Since dispensation and suction of the solvent are carried out in the state of the positions of the gripped coating solution nozzle 3, solvent nozzle 4, and solvent suction unit 35 being fixed, suction operation can be carried out efficiently.

This invention is not limited to the foregoing embodiment, but may be modified as follows:

(1) In the foregoing embodiment, the solvent nozzle 4 is attached to the nozzle moving mechanism 5. In this regard, for example, the nozzle moving mechanism 5 may have a mechanism capable of gripping the solvent nozzle 4 to attach the solvent nozzle 4 to the nozzle moving mechanism 5. In this case, the nozzle moving mechanism 5 grips the coating solution nozzle 3 with the gripper 23, and further grips the solvent nozzle 4 with a gripper not shown.

Figure 5:
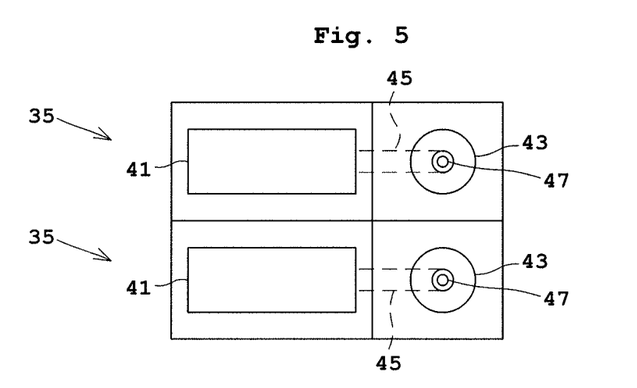
FIG. 5 is a plan view showing solvent suction units according to a modification.

(2) In the foregoing embodiment and modification (1), as shown in FIG. 2, one solvent suction unit 35 is provided between the two adjacent holding and spinning units 2. In this regard, for example, ten solvent suction units 35 may be provided which correspond in number to the ten (plurality of) coating solution nozzles 3. Where a plurality of solvent suction units 35 are provided, as shown in FIG. 5, a construction is made such that the solvent supplied to each retaining vessel 43 of the solvent suction units 35 is not supplied to the other retaining vessels 43. The solvent is therefore selectively supplied to each retaining vessel 43 from the solvent nozzle 4.

In this case, the controller 51 operates the nozzle moving mechanism 5 to move the gripped coating solution nozzle 3 and solvent nozzle 4 to the same one solvent suction unit 35 of the ten solvent suction units 35. In suction operation, dispensation and suction of the solvent are carried out in the same solvent suction unit 35.

The solvent suction units 35 may be provided, for example, in a number (plurality) smaller than the ten coating solution nozzles 3. Since the solvent suction units 35 are not provided in the number corresponding to the ten coating solution nozzles 3, the construction of the solvent suction units 35 becomes simple, thereby to hold down cost. Further, since the solvent suction units 35 are not provided in the number corresponding to the ten coating solution nozzles 3, the retaining vessels 43 of the solvent suction units 35 can be cleaned easily. A plurality of solvent suction units 35, although it is preferable to be provided separately from one another, may have an integral construction.

Figure 6:
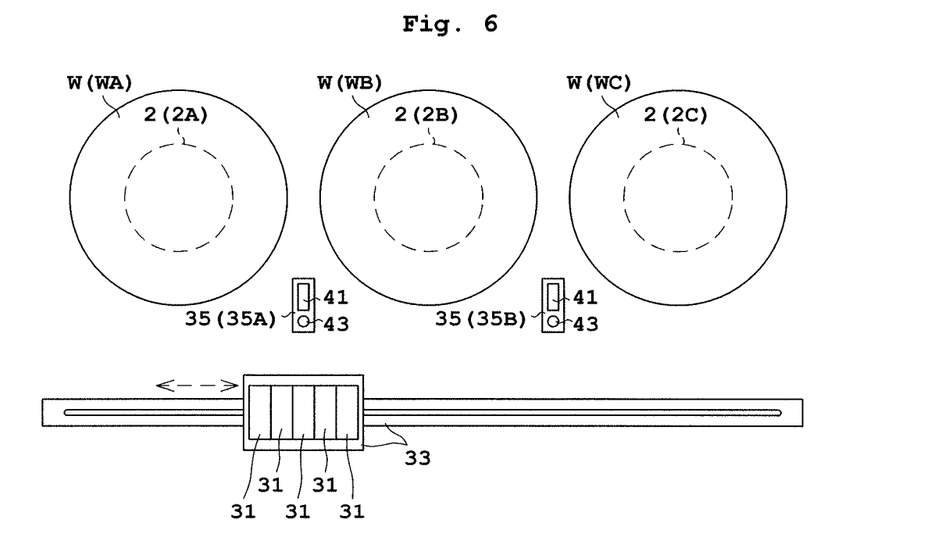
FIG. 6 is a plan view showing three holding and spinning units and two solvent suction units according to a modification.

(3) In the foregoing embodiment and each modification, one solvent suction unit 35 is provided between the two adjacent holding and spinning units 2 in FIG. 2. In this regard, where three holding and spinning units 2 are provided as shown in FIG. 6, for example, one first solvent suction unit 35A may be disposed between the first holding and spinning unit 2A and second holding and spinning unit 2B, and furthermore one second solvent suction unit 35B between the second holding and spinning unit 2B and third holding and spinning unit 2C. That is, solvent suction units 35 may be installed separately in two locations (plural locations).

In the respective positions, ten first solvent suction units 35A and second solvent suction units 35B may be provided as corresponding in number to the ten coating solution nozzles 3, or in a number (plural) less than the ten coating solution nozzles 3. The same applies also to the case of four or more holding and spinning units 2. In FIG. 6, the solvent suction units 35 may be provided in one location for the three holding and spinning units 2A-2C.

Figure 7:
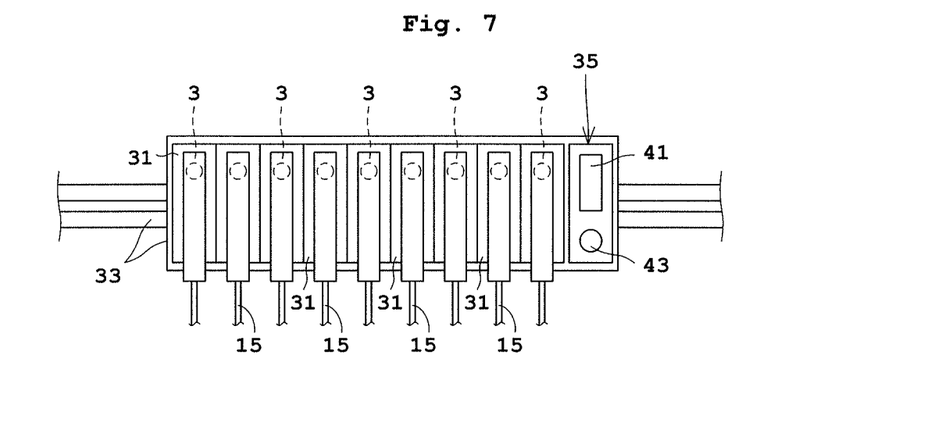
FIG. 7 is a plan view showing standby pots and a solvent suction unit according to a modification.

(4) In the foregoing embodiment and each modification, the solvent suction unit 35 is provided between the two adjacent holding and spinning units 2 in FIG. 2. In this regard, as in FIG. 7, the solvent suction unit 35 may be disposed adjacent the standby pots 31 to be moved together with the group of standby pots 31 by the standby pot moving mechanism 33. Even in this case, the solvent suction unit 35 is provided separate from the standby pots 31, whereby component replacement can be done easily.

(5) In the foregoing embodiment and each modification, the solvent suction unit 35 has two vessels, i.e. the receiving vessel 41 and retaining vessel 43 as shown in FIG. 3(a) and FIG. 3(b). In this regard, when there is almost no influence of splashing of the solvent, the retaining vessel may be one vessel that serves as both the receiving vessel 41 and retaining vessel 43.

(6) In the foregoing embodiment and each modification, as shown in FIG. 4(a)-FIG. 4(c), solvent suction operation is carried out in the state where positions (at least horizontal positions) of the gripped coating solution nozzle 3, solvent nozzle 4, and solvent suction unit 35 are fixed. However, these positions, instead of being fixed, may be moved as occasion demands.

Figure 8:
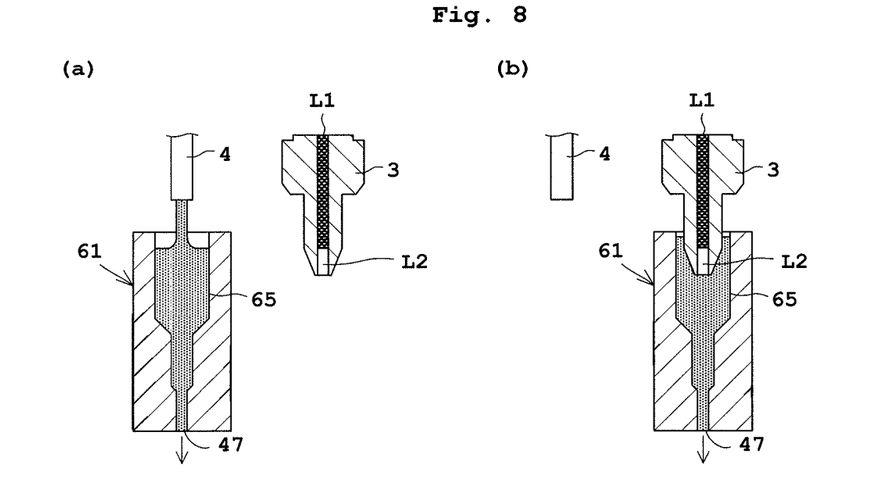

That is, as shown in FIG. 8(a) and FIG. 8(b), the solvent suction unit 61 may have a single retaining vessel 65 for receiving the solvent and temporarily retaining the solvent. As shown in FIG. 8(a), the controller 51 operates the nozzle moving mechanism 5 to move the solvent nozzle 4 to the solvent suction unit 61 (retaining vessel 65), and causes the solvent to be dispensed from the moved solvent nozzle 4 to the solvent suction unit 61.

As shown in FIG. 8(b), the controller 51 operates the nozzle moving mechanism 5 to cause at least horizontal movement (e.g. horizontal movement and vertical movement) of the gripped coating solution nozzle 3 to the same solvent suction unit 61 to which the solvent has been dispensed. After this movement of the coating solution nozzle 3, the controller 51 causes the gripped coating solution nozzle 3 to suck the solvent retained in the solvent suction unit 61. Consequently, the solvent suction unit 61 can be reduced in size. The construction of the solvent suction unit 61 can therefore be made still simpler to hold down cost.

Figure 9:
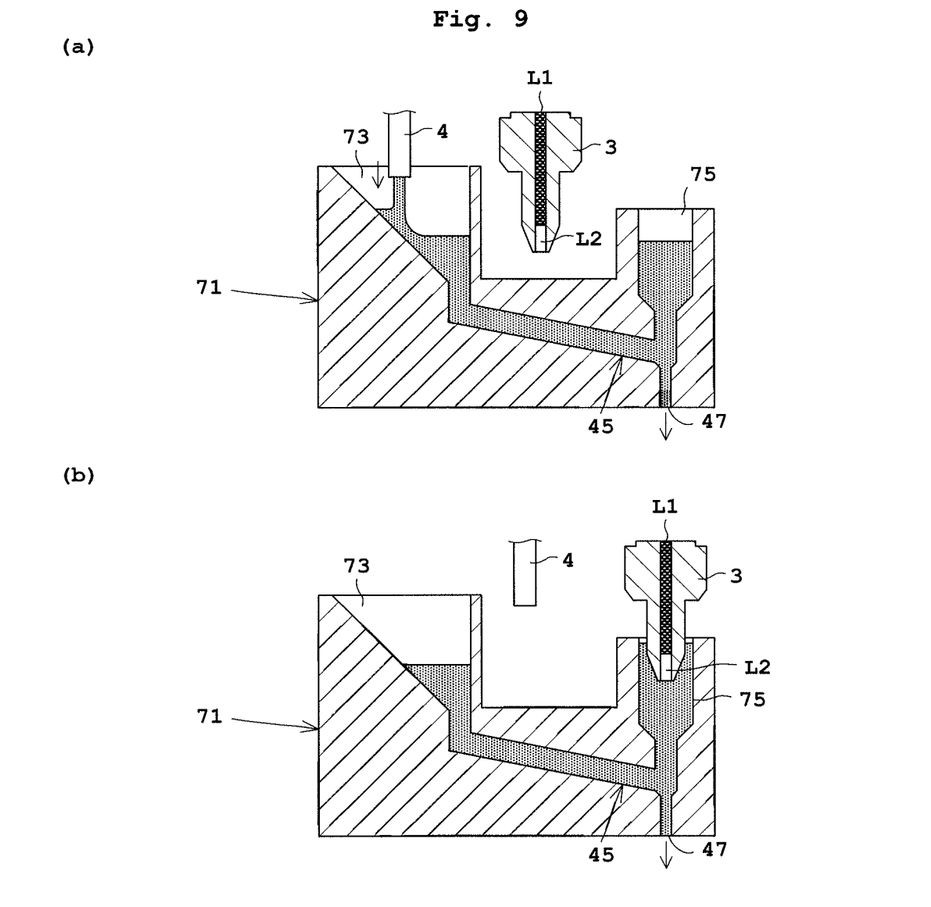

Further, as shown in FIG. 9(a) and FIG. 9(b), a solvent suction unit 71 may be provided which has a receiving vessel 73 for receiving the solvent, and a retaining vessel 75 for temporarily retaining the solvent. The coating solution nozzle 3 and solvent nozzle 4 in FIG. 9(a) and FIG. 9(b) cannot move to the receiving vessel 73 and retaining vessel 75 at the same time. As in FIG. 8(a) and FIG. 8(b), therefore, the horizontal movement of the coating solution nozzle 3 and solvent nozzle 4 is carried out by the nozzle moving mechanism 5 between the operations for dispensing and sucking the solvent. In FIG. 8(a), FIG. 8(b), FIG. 9(a), and FIG. 9(b), the solvent suction units 61 and 71 may be moved horizontally to the coating solution nozzle 3 and solvent nozzle 4.

(7) In the foregoing embodiment and each modification, although the solvent retained in the retaining vessel 43 is sucked once, part or all of the sucked solvent may be ejected and sucked again. This solvent sucking and ejecting operation may be repeated. This enables dissolution of the coating solution to eject a solvent with high concentration of the coating solution, whereby a relatively fresh solvent can be sucked.

(8) In the foregoing embodiment and each modification, the coating apparatus 1 has been illustrated as an example of substrate treating apparatus, but a developing apparatus, for example, can be employed. In this case, the coating solution nozzles 3 in the embodiment may dispense a developer, and the solvent nozzle 4 in the embodiment may dispense deionized water, for example.

REFERENCE SIGNS LIST

1 . . . coating apparatus
2 . . . holding and spinning units
3 . . . coating solution nozzles
4 . . . solvent nozzle
5 . . . nozzle moving mechanism
23 . . . gripper
31 . . . standby pots
35, 61, 71 . . . solvent suction units
41, 73 . . . receiving vessels
43, 65, 75 . . . retaining vessels
45 . . . communicating pipe
45a-45c . . . piping
47 . . . drain port
51 . . . controller
SV . . . suckback valve

The invention claimed is:

1. A substrate treating apparatus comprising:
a plurality of first nozzles for dispensing a first treating liquid to substrates;
a second nozzle for dispensing a second treating liquid to the substrates;
a nozzle moving mechanism for gripping one of the plurality of first nozzles and moving the gripped first nozzle and the second nozzle together;
a suction unit for allowing the gripped first nozzle to suck the second treating liquid, the suction unit including a receiving vessel for receiving the second treating liquid dispensed from the second nozzle, and a retaining vessel provided separate from the receiving vessel and communicating with the receiving vessel; and
a controller for causing the nozzle moving mechanism to move at least the second nozzle to the suction unit, causing the moved second nozzle to dispense the second treating liquid to the receiving vessel, and causing the gripped first nozzle to suck the second treating liquid retained in the retaining vessel.

2. The substrate treating apparatus according to claim 1, wherein:
one or more suction units are provided in a number smaller than the plurality of first nozzles; and
the controller causes the nozzle moving mechanism to move at least the second nozzle to one of the suction units.

3. The substrate treating apparatus according to claim 1, further comprising a nozzle standby portion for receiving the first nozzles on standby;
wherein the suction unit is provided separate from the nozzle standby portion.

4. The substrate treating apparatus according to claim 3, further comprising a plurality of holding and spinning units for holding and spinning the substrates;
wherein the suction unit is provided between two adjacent holding and spinning units of the plurality of holding and spinning units.

5. The substrate treating apparatus according to claim 1, wherein the controller causes the nozzle moving mechanism to move the first nozzle and the second nozzle to the suction unit, after the movement, in a state of positions of the gripped first nozzle, the second nozzle, and the suction unit being fixed, causes the second nozzle to dispense the second treating liquid to the suction unit, and causes the gripped first nozzle to suck the second treating liquid retained in the suction unit to which the second treating liquid has been dispensed.

6. The substrate treating apparatus according to claim 1, wherein:
the controller causes the nozzle moving mechanism to move the second nozzle to the suction unit, and causes the moved second nozzle to dispense the second treating liquid to the suction unit; and
the controller causes the nozzle moving mechanism to move the gripped first nozzle at least horizontally to the suction unit to which the second treating liquid has been dispensed, and after the movement of the first nozzle, causes the gripped first nozzle to suck the second treating liquid retained in the suction unit.

7. The substrate treating apparatus according to claim 1, wherein the first treating liquid is a coating solution for forming film on the substrates.

8. The substrate treating apparatus according to claim 1, wherein the second treating liquid is a solvent.

9. The substrate treating apparatus according to claim 1, further comprising a plurality of holding and spinning units for holding and spinning the substrates;
wherein the suction unit is provided between two adjacent holding and spinning units of the plurality of holding and spinning units.

10. A method of controlling a substrate treating apparatus having a plurality of first nozzles for dispensing a first treating liquid to substrates, and a second nozzle for dispensing a second treating liquid to the substrates, the method comprising:
a step of causing a nozzle moving mechanism for gripping one of the plurality of first nozzles and moving the gripped first nozzle and the second nozzle together to move at least the second nozzle to a suction unit;
a step of causing the moved second nozzle to dispense the second treating liquid to a receiving vessel of the suction unit; and
a step of causing the gripped first nozzle to suck the second treating liquid retained in a retaining vessel of the suction unit, the retaining vessel being provided separate from the receiving vessel and communicating with the receiving vessel.

* * * * *